US008492872B2

(12) United States Patent
Yang et al.

(10) Patent No.: US 8,492,872 B2
(45) Date of Patent: Jul. 23, 2013

(54) ON-CHIP INDUCTORS WITH THROUGH-SILICON-VIA FENCE FOR Q IMPROVEMENT

(75) Inventors: Li-Chun Yang, Tainan (TW); Ming-Ta Yang, Hsinchu (TW); Chao-Shun Hsu, San-Shin (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 723 days.

(21) Appl. No.: 11/868,392

(22) Filed: Oct. 5, 2007

(65) Prior Publication Data
US 2009/0090995 A1 Apr. 9, 2009

(51) Int. Cl.
*H01L 27/08* (2006.01)
(52) U.S. Cl.
USPC ............. 257/531; 257/528; 257/758; 336/84; 438/3
(58) Field of Classification Search
USPC ................... 257/531, 532, 520, E21.022, 528, 257/758; 438/3; 455/91; 336/84
See application file for complete search history.

(56) References Cited

U.S. PATENT DOCUMENTS

| | | | | |
|---|---|---|---|---|
| 6,274,920 B1 * | 8/2001 | Park et al. | | 257/531 |
| 6,452,249 B1 | 9/2002 | Maeda et al. | | |
| 6,538,300 B1 * | 3/2003 | Goldberger et al. | | 257/532 |
| 6,593,838 B2 * | 7/2003 | Yue | | 336/84 C |
| 6,611,041 B2 | 8/2003 | Maeda et al. | | |
| 6,905,889 B2 * | 6/2005 | Lowther | | 438/3 |
| 6,921,959 B2 * | 7/2005 | Watanabe | | 257/531 |
| 6,989,578 B2 * | 1/2006 | Yeh et al. | | 257/531 |
| 2002/0084509 A1 * | 7/2002 | Ballantine et al. | | 257/531 |
| 2002/0109204 A1 * | 8/2002 | Acosta et al. | | 257/531 |
| 2004/0104449 A1 * | 6/2004 | Yoon et al. | | 257/528 |
| 2004/0195692 A1 * | 10/2004 | Adan | | 257/758 |
| 2004/0198253 A1 * | 10/2004 | Kondo et al. | | 455/91 |
| 2008/0073747 A1 * | 3/2008 | Chao et al. | | 257/520 |

OTHER PUBLICATIONS

Murphy, Olive H., et al., "Design of Multiple-Metal Stacked Inductors Incorporating an Extended Physical Model", IEEE Transactions on Microwave Theory and Techniques, vol. 53, No. 6, Jun. 2005, pp. 2063-2072.
Shi, Jinglin, et al., "The Enhancement of Q Factor for Patterned Ground Shield Inductors at High Temperatures", IEEE Transactions on Magnetics, vol. 42, No. 7, Jul. 2006, pp. 1873-1875.
Yue, C. Patrick, et al., "On-Chip Spiral Inductors with Patterned Ground Shields for Si-Based RF IC's", IEEE Journal of Solid-State Circuits, vol. 33, No. 5, May 1998, pp. 743-752.

* cited by examiner

*Primary Examiner* — Eugene Lee
*Assistant Examiner* — Fang-Xing Jiang
(74) *Attorney, Agent, or Firm* — K&L Gates LLP

(57) ABSTRACT

A semiconductor structure for providing isolations for on-chip inductors comprises a semiconductor substrate, one or more on-chip inductors formed above the first semiconductor substrate, a plurality of through-silicon-vias formed through the first semiconductor substrate in a vicinity of the one or more on-chip inductors, and one or more conductors coupling at least one of the plurality of through-silicon-vias to a ground, wherein the plurality of through-silicon-vias provide isolations for the one or more on-chip inductors.

11 Claims, 5 Drawing Sheets

ON-CHIP INDUCTORS WITH THROUGH-SILICON-VIA FENCE FOR Q IMPROVEMENT

BACKGROUND

The present invention relates generally to semiconductor device structures, and, more particularly, to on-chip inductor's shielding structures.

Modern analog circuits increasingly embed inductors on the chip. FIG. 1A illustrates an on-chip spiral inductor 100, which is formed by a spiral metal line 106. A first terminal 102 of the inductor 100 is on the same metal layer of the spiral metal line 106. A second terminal 104 is connected to an end of the spiral metal line 106 through vias 120 and a metal line 110 on another metal layer. FIG. 1B is a cross-sectional view of the on-chip spiral inductor 100 at a location A-A'. The inductor 100 is formed inside a dielectric material 130 on top of a semiconductor substrate 140.

Performance of these analog circuits depends heavily on the quality of the inductor, where poor inductor quality factor (Q) of silicon processes leads to degradation in circuit efficacy, especially at radio frequency (RF) and microwave frequencies. The inductor quality factor (Q) is defined as:

$$Q = 2\pi \cdot \frac{\text{energy} - \text{stored}}{\text{energy} - \text{loss} - \text{in} - \text{one} - \text{oscillation} - \text{circle}} \quad (1)$$

The inductor Q degrades at high frequencies due to energy dissipation in the semiconductor substrate. Noise coupling via the substrate at gigahertz frequencies has also been reported. As inductors occupy substantial chip area, they can potentially be the source and receptor of detrimental noise coupling. Therefore, decoupling the inductor from the surrounding materials, including the substrate, can enhance the overall performance of the inductor: increase Q, improve isolation, and simplify modeling.

FIG. 2 is a cross-sectional view of a patterned-ground-shielding (PGS) 203 traditionally used to provide the decoupling of the inductor 100 from the semiconductor substrate 140. The PGS 203 is commonly inserted between the inductor 100 and the substrate 140, and formed by either a polysilicon layer or a metal layer. However, it is often difficult to find optimized widths and spacings for the PGS 203 to achieve maximum Q improvement. The fact that the PGS 203 is formed inside the dielectric layer 130 also limits its effectiveness in improving the Q of the inductor 100.

As such, what is desired are alternative shielding structures for on-chip inductors that may benefit from new semiconductor processes, and these alternative shielding structures are often augmentative to traditional shielding structures.

SUMMARY

In view of the foregoing, the present invention provides a semiconductor structure for providing isolations for on-chip inductors. According to one aspect of the present invention, the semiconductor structure comprises a semiconductor substrate, one or more on-chip inductors formed above the first semiconductor substrate, a plurality of through-silicon-vias formed through the first semiconductor substrate in a vicinity of the one or more on-chip inductors, and one or more conductors coupling at least one of the plurality of through-silicon-vias to a ground, wherein the plurality of through-silicon-vias provide isolations for the one or more on-chip inductors.

According to another aspect of the present invention, the one or more conductors that couple at least one through-silicon-via of the plurality of through-silicon-vias to a ground are formed by a metallized backside of the semiconductor substrate.

Additionally, traditional patterned-ground-shielding structure can be combined with the semiconductor structure of the present invention by extending the plurality of through-silicon-vias into making contact with the patterned-ground-shielding conductors. Besides, in stacked chip application, both top and bottom chips may have through-silicon-vias in the vicinity of the on-chip inductors.

The construction and method of operation of the invention, however, together with additional objects and advantages thereof will be best understood from the following description of specific embodiments when read in connection with the accompanying drawings.

Figure 1A:
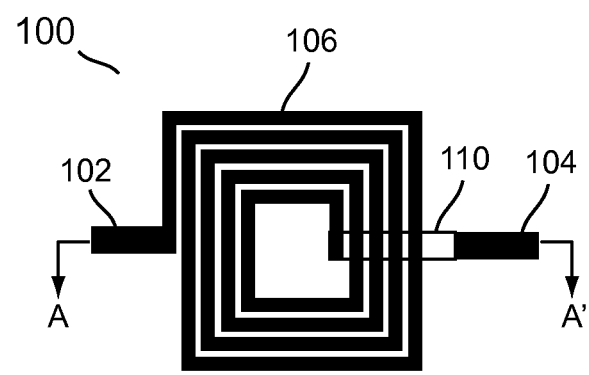
FIGS. 1A and 1B illustrate an on-chip spiral inductor.
Figure 1B:
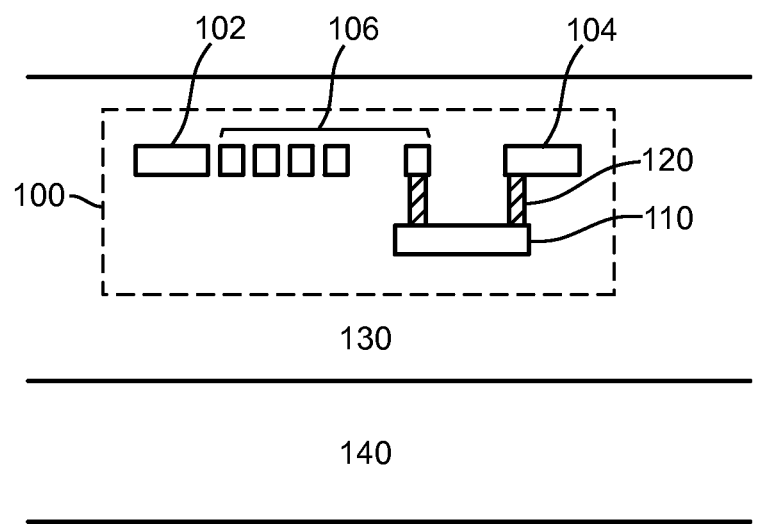
Figure 2:
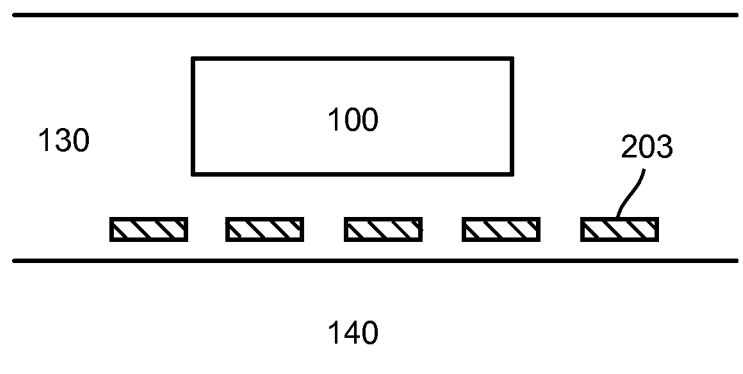
FIG. 2 illustrates a traditional patterned-ground-shielding for the on-chip spiral inductor.

The drawings accompanying and forming part of this specification are included to depict certain aspects of the invention. A clearer conception of the invention, and of the components and operation of systems provided with the invention, will become more readily apparent by referring to the exemplary, and therefore non-limiting, embodiments illustrated in the drawings, wherein like reference numbers (if they occur in more than one view) designate the same elements. The invention may be better understood by reference to one or more of these drawings in combination with the description presented herein. It should be noted that the features illustrated in the drawings are not necessarily drawn to scale.

DESCRIPTION

The following will provide a detailed description of a through-silicon-via (TSV) based shielding structure for improving the quality factor (Q) of on-chip inductors.

The TSV is a technology of forming via holes through a semiconductor substrate, which may be made of silicon or other materials. Therefore, the term, through-silicon, may also be called "through-wafer". The TSV technology is developed to shorten interconnect lengths and to achieve 3 dimensional structure. Operations in the 3-D integration process include through-wafer via formation, deep via etching, laser-drilled vias, deep trench capacitor technology, via filling, deposition of diffusion barrier and adhesion layers, metallization, and wafer thinning, dicing, alignment and bonding. There are currently three process sequences available for the formation of through-wafer vias for wafer-level 3-D devices. In a front-end process sequence, vias can be fabricated using deep trench capacitor technology at any fab capable of embedded DRAM technology, before transistors and interconnect are processed on the chips. Such chips would subsequently go to semiconductor packaging houses where backside thinning would expose the bottom of the vias and allow backside interconnect formation. This sequence places the burden of via formation in the hands of the fab and eliminates the need to leave room within or between cells for post-fab via creation.

The second process sequence also requires chips to be specifically designed for 3-D stacking. Specific areas on the silicon, in the interconnect layers, and on the top pad surface are set aside as exclusion zones. Through-wafer connection is subsequently created in the completed chips by etching vias through these exclusion zones and filling them with insulators and conductive metals.

The third process sequence is used when chips not specifically designed for 3-D integration are stacked. In this sequence, the connecting vias are formed by redistributing pads into the area between the peripheral pads and via streets. Vias are then etched and filled in these natural exclusion zones.

Figure 3A:
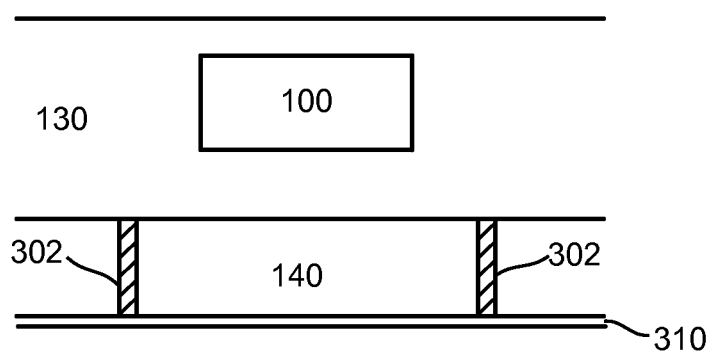
FIGS. 3A and 3B illustrate a first inductor shielding structure formed by through-silicon-vias and a metallized backside according to a first embodiment of the present invention.
Figure 3B:
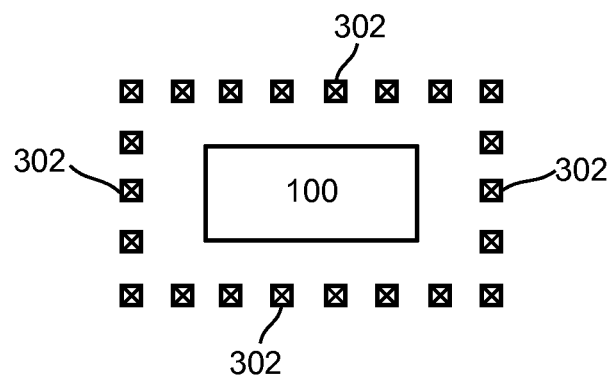

FIGS. 3A and 3B illustrate a first inductor shielding structure formed by a plurality of TSVs 302 and a metallized backside (MB) 310 according to a first embodiment of the present invention. FIGS. 3A and 3B are a cross-sectional view and a layout view, respectively, of the first inductor shielding structure. Referring to FIG. 3A, the TSVs 302 is formed through the substrate 140. The MB 310 has contacts with the TSVs 302 to provide a ground connection to the TSVs 302. Referring to FIG. 3B, a plurality of TSVs 302 is placed around the on-chip inductor 100, forming a grounded shielding fence for isolating the inductor 100. With the shielding fence formed by the TSVs 302 surrounding and under the inductor 100, Eddy current distributions in the substrate 140 will be stopped. Therefore, the Q factor of the inductor 100 will be improved. Besides, with better grounding of the MB 310 and better isolation of the TSVs 302, the unwanted or high-order mode will also be suppressed.

Minimum cross-sectional widths and lengths of the TSVs 302 and minimum spacings between adjacent TSVs are determined by a process technology being employed to form the TSVs 302. But other width, length and spacing may also be used to achieve an optimized Q improvement.

Although a rectangularly arranged TSV fence is illustrated in FIG. 3B. A skilled artisan may realize that it is the enclosing nature of the TSV fence provides the isolation to the on-chip inductor 100, therefore, other shapes of TSV arrangements, such as a U-shape, a circle or even a double circle, may provide equally well Q improvement to the inductor 100.

Although only the TSVs 302 surrounding the on-chip inductor 100 is illustrated in FIG. 3A, a skilled artisan will realize that TSVs under the on-chip inductor 100 can also provide isolation and Q improvement to the on-chip inductor 100. An on-chip inductor may have guard-ring of its own, and such guard-ring may be connected to the TSV fence.

Figure 4A:
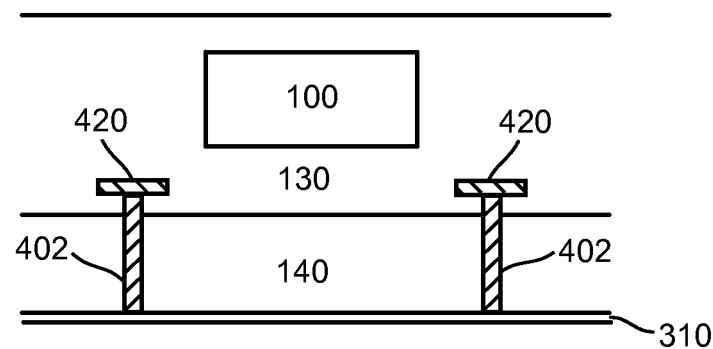
FIGS. 4A and 4B illustrates a second inductor shielding structure combining the through-silicon-vias with the traditional patterned-ground-shielding according to a second embodiment of the present invention.
Figure 4B:
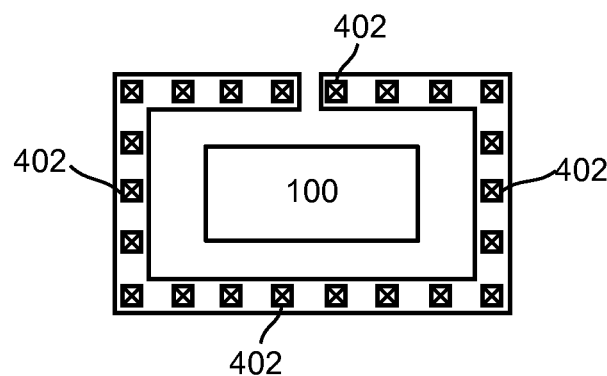

FIGS. 4A and 4B illustrates a second inductor shielding structure combining the TSVs 402 with the traditional patterned-ground-shielding (PGS) 420 according to a second embodiment of the present invention. FIG. 4A is a cross-sectional view, while FIG. 4B is a layout view of the second inductor shielding structure. The PGS 420 is formed in a metal or polysilicon layer in the dielectric material 130. In forming the TSVs 420, an etching process, via holes are etched not only through the semiconductor substrate 140, but also through part of the dielectric material 130 and stopped by the PGS layer 420. Grounding to both the TVSs 402 and the PGS 420 are provided by the MB 310. Both the TSVs 402 and PGS 420 provide isolation to the on-chip inductor 100, and better Q improvement thereof.

Figure 5:
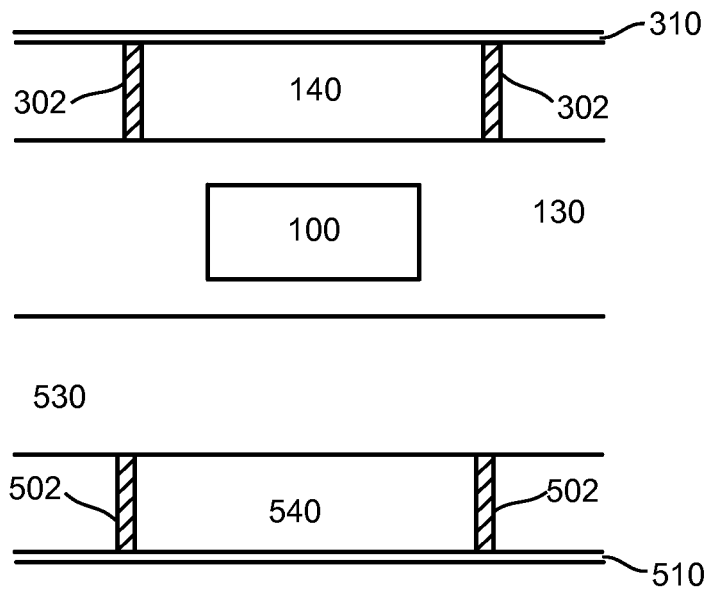
FIG. 5 illustrates the through-silicon-vias shielding structure is applied in a face-to-face stacked chip according to a third embodiment of the present invention.

FIG. 5 illustrates the TSV shielding structure is applied in a face-to-face stacked chip according to a third embodiment of the present invention. A top chip is identical to the inductor structure shown in FIG. 3A, which includes the semiconductor substrate 140 and the dielectric layer 130. The on-chip inductor 100 is formed in the dielectric layer 130. The TSVs 302 are formed through the substrate 140. The MB 310 provides the ground connection to the TSVs 302. A second chip is stacked face-to-face on the first chip. The so called face-to-face refers to dielectric layers 130 and 530 of the first and second chip, respectively, come into contact with each other. The second chip includes a second semiconductor substrate 540 and a second dielectric layer 530. Another plurality of TSVs 502 is formed through the second substrate 540. Another MB 510 provides the ground connection to the plurality of TSVs 502. Both the TSVs 302 and the pluralities of TSVs 502 are placed around the on-chip inductor 100 and provide isolations thereto.

Figure 6:
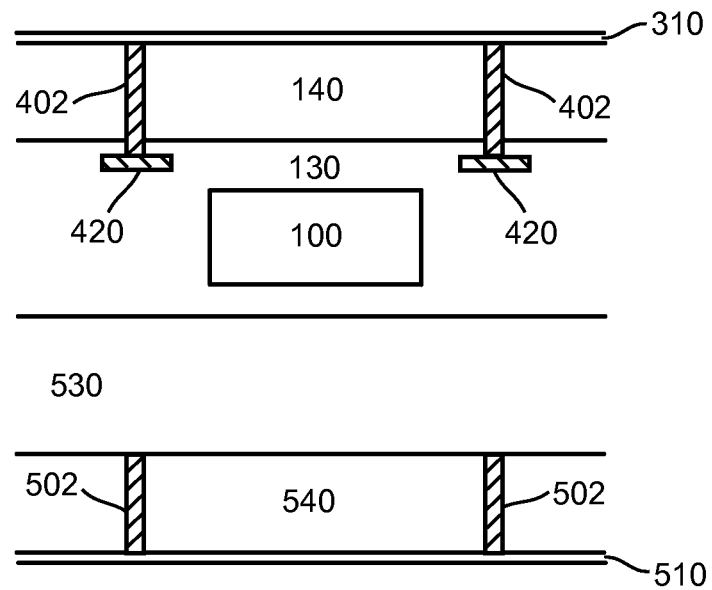
FIG. 6 illustrates the combination of through-silicon-via and traditional patterned-ground-shielding being applied to the face-to-face stacked chip according to a fourth embodiment of the present invention.

FIG. 6 illustrates the combination of TSV and traditional PGS being applied to the face-to-face stacked chip according to a fourth embodiment of the present invention. The chip on top is the combination of TSV and traditional PGS structure shown in FIG. 4A. The chip on bottom is the same as the second chip shown in FIG. 5. The traditional PGS adds another layer of isolation to the on-chip inductor 100 of the face-to-face stacked chip.

Figure 7:
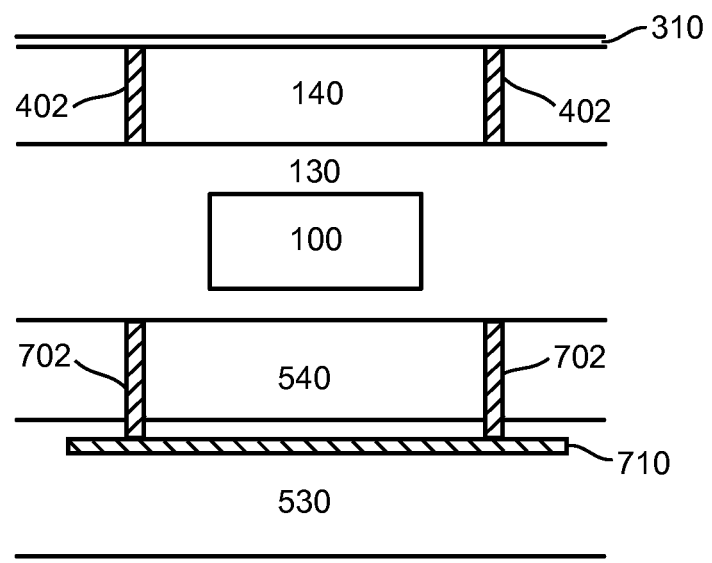
FIG. 7 illustrates a face-to-back stacked chip employing the through-silicon-vias according to a fifth embodiment of the present invention.

FIG. 7 illustrates a face-to-back stacked chip employing the TSVs according to a fifth embodiment of the present invention. A top chip here is the same as the top chip shown in FIG. 5, which is stacked on a bottom chip in a face-to-back fashion, i.e., the dielectric layer 130 of the top chip comes into contact with a substrate 540 of the bottom chip. The bottom chip includes a dielectric layer 530. As shown in FIG. 7, TSVs 702 of the bottom chip make contacts to a metal layer 710 inside the dielectric layer 530. The metal layer 710 provides the ground connection to the TSVs 702. A skilled artisan may realize that other conduction layer, such as polysilicon, may be used in place of the metal layer 710.

Figure 8:
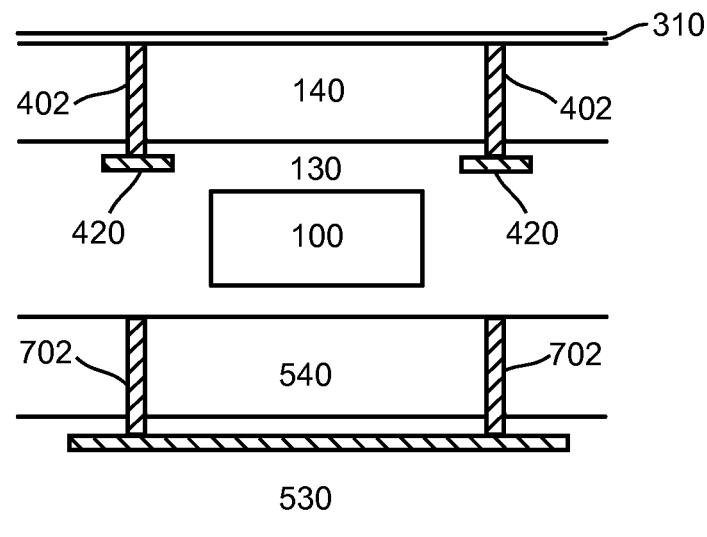
FIG. 8 illustrates a face-to-back stacked chip employing a combination of the through-silicon-vias and the traditional patterned-ground-shielding according to a sixth embodiment of the present invention.

FIG. 8 illustrates a face-to-back stacked chip employing a combination of the TSVs and the traditional PSG according to a sixth embodiment of the present invention. Here a top chip is the same as the top chip shown in FIG. 6, and a bottom chip is the same as the bottom chip shown in FIG. 7. The top and bottom chip are stacked in a face-to-back fashion, i.e., the dielectric layer 130 of the top chip comes into contact with the substrate 540 of the bottom layer.

Referring to FIGS. 5 through 8, the way two chips are stacked, either face-to-face or face-to-back, is determined by various design needs of the stacked chip. The examples shown here in FIGS. 5 through 8, illustrate that TSV technologies can equally applied to both face-to-face and face-toback cases for providing isolations to the on-chip inductor 100. Variations available to the non-stacked chips shown in FIGS. 3A and 4A are also applicable to the stacked chips shown in FIGS. 5 through 8.

Figure 9A:
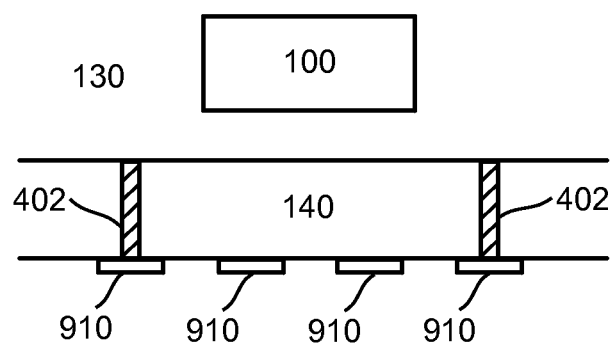
FIGS. 9A and 9B illustrate an inductor shielding structure formed by patterned metallized backside and the through-silicon-vias according to a seventh embodiment of the present invention.
Figure 9B:
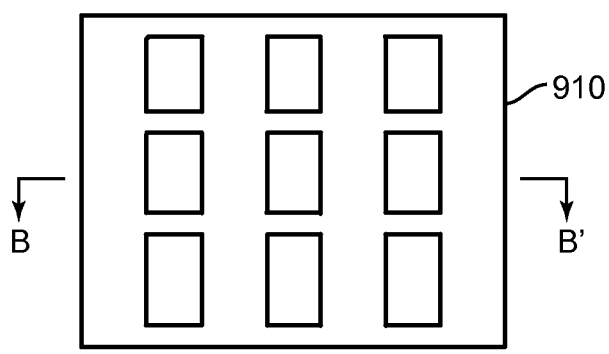

FIGS. 9A and 9B illustrate an inductor shielding structure formed by patterned metallized backside (MB) and the TSVs according to a seventh embodiment of the present invention. FIG. 9A is a cross-section made at location B-B' shown in FIG. 9B. The inductor shielding structure shown in FIGS. 9A and 9B is the same as the one shown in FIGS. 3A and 3B, except that the MB 910 shown in FIGS. 9A and 9B is patterned. Referring to FIG. 9A, the MB 910 still makes contacts to the TSVs 402. FIG. 9B shows an exemplary mesh pattern etched on the MB 910. Apparently the patterned MB can also be applied to the stacked chips shown in FIGS. 5 through 8.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A semiconductor device comprising:
a first semiconductor substrate;
one or more dielectric layers formed on the first semiconductor substrate;
one or more on-chip inductors formed above the first semiconductor substrate;
a first plurality of through-silicon-vias formed through the first semiconductor substrate, extended from the first semiconductor substrate through part of the one or more dielectric layers and disposed to surround the on-chip inductors in a plan view;
a first shielding patterned ground (PGS) layer disposed in the dielectric layer below the one or more on-chip inductors and to surround the on-chip inductors in the plan view, the first PGS layer being connected to one end of each first plurality of through-silicon-vias that extend in the dielectric layer for providing isolation to the on-chip inductors; and
a first metalized backside layer connected to other end of each of the first plurality of through-silicon-vias to be a ground.

2. The semiconductor device of claim 1, wherein the first plurality of through-silicon-vias is arranged in the form of a fence surrounding and under the one or more on-chip inductors.

3. The semiconductor device of claim 1, wherein the first plurality of through-silicon-vias is placed underneath the one or more on-chip inductors.

4. The semiconductor device of claim 1, wherein the first metalized backside layer is formed by a metallized backside of the first semiconductor substrate.

5. The semiconductor device of claim 1, wherein the first shielding patterned ground (PGS) lay is patterned-ground-shielding for the one or more on-chip inductors.

6. A semiconductor device comprising:
a semiconductor substrate;
one or more dielectric layers formed on the semiconductor substrate;
one or more on-chip inductors formed above the semiconductor substrate;
a plurality of through-silicon-vias formed through the semiconductor substrate, extended from the semiconductor substrate through part of the one or more dielectric layers and disposed to surround the on-chip inductors in a plan view;
a first shielding patterned ground (PGS) layer disposed in the dielectric layer below the one or more on-chip inductors and to surround the on-chip inductors in the plan view, the first PGS layer being connected to one end of each first plurality of through-silicon-vias that extend in the dielectric layer for providing isolation to the on-chip inductors; and
a metallized backside layer connected to other end of each of the plurality of through-silicon-vias to be a ground.

7. The semiconductor device of claim 6, wherein the plurality of through-silicon-vias is arranged in the form of a fence surrounding and under the one or more on-chip inductors.

8. The semiconductor device of claim 6, wherein the plurality of through-silicon-vias is placed underneath the one or more on-chip inductors.

9. The semiconductor device of claim 6, wherein the first shielding patterned ground (PGS) layer is patterned-ground-shielding for the one or more on-chip inductors.

10. A semiconductor device comprising:
a first semiconductor substrate;
one or more dielectric layers formed on the first semiconductor substrate;
one or more on-chip inductors formed above the first semiconductor substrate;
a first plurality of through-silicon-vias formed through the first semiconductor substrate, extended from the semiconductor substrate through part of the one or more dielectric layers and disposed to surround the on-chip inductors in a plan view, the first plurality of through-silicon-vias being arranged in the form of a fence surrounding the one or more on-chip inductors;
a first shielding patterned ground (PGS) layer disposed in the dielectric layer below the one or more on-chip inductors and to surround the on-chip inductors in the plan view, the first PGS layer being connected to one end of each first plurality of through-silicon-vias that extend in the dielectric layer for providing isolation to the on-chip inductors; and
a metallized backside layer connected to other end of each of the plurality of through-silicon-vias to be a ground.

11. The semiconductor device of claim 10, wherein the first shielding patterned ground (PGS) layer is a patterned-ground-shielding conductor for the one or more on-chip inductors above the first semiconductor substrate in the vicinity of the one or more on-chip inductors.

* * * * *